United States Patent [19]

Burgyan

[11] 4,109,054

[45] Aug. 22, 1978

[54] COMPOSITES OF GLASS-CERAMIC-TO-METAL, SEALS AND METHOD OF MAKING SAME

[75] Inventor: Stephan J. Burgyan, Lakewood, Ohio

[73] Assignee: Ferro Corporation, Cleveland, Ohio

[21] Appl. No.: 688,018

[22] Filed: May 19, 1976

[51] Int. Cl.² .................. B32B 17/06; B32B 15/04
[52] U.S. Cl. ..................... 428/433; 106/53; 428/432; 428/427; 428/450; 428/469
[58] Field of Search ............. 428/433, 427, 432, 450, 428/469; 106/53

[56] References Cited

U.S. PATENT DOCUMENTS

| 2,882,187 | 4/1959 | Kwate | 428/427 |
|---|---|---|---|
| 2,962,389 | 11/1960 | Menke | 428/433 |
| 3,047,409 | 7/1962 | Slayter | 106/53 |
| 3,222,219 | 12/1965 | Saunders | 428/433 |
| 3,249,466 | 5/1966 | Lusher | 428/427 |
| 3,510,343 | 5/1970 | Twells | 428/427 |
| 3,645,839 | 2/1972 | Veres | 428/433 |
| 3,676,292 | 7/1972 | Pryor | 428/433 |
| 3,852,148 | 12/1974 | Pryor | 428/450 |
| 3,922,471 | 11/1975 | Ellis | 428/433 |
| 3,951,669 | 4/1976 | Malmendier | 106/53 |

*Primary Examiner*—Ellis Robinson
*Attorney, Agent, or Firm*—Milton L. Simmons

[57] ABSTRACT

Sealing glass compositions are provided as sealants for copper-aluminum alloys.

4 Claims, No Drawings

COMPOSITES OF GLASS-CERAMIC-TO-METAL, SEALS AND METHOD OF MAKING SAME

As disclosed in U.S. Pat. No. 3,676,292 incorporated herein by reference, there are many metal-glass-ceramic applications and systems which have in common the bonding of a glass or ceramic material to the surface of a metal. One common application is for making hermetic seals for metal cased semiconductor devices. Characteristically, in the known glass or ceramic-to-metal seals, the oxide on the metal acts as the bonding agent in that it is bonded to the underlying metal and the glass or ceramic material. Therefore, the characteristics of the metal oxide exert a profound influence upon the overall properties of the glass or ceramic-to-metal bond.

Most metal oxides and mixtures of metal oxides which have been developed upon the surface of most metals and alloys, in accordance with the prior art, possess poor mechanical properties. Therefore, the prior art glass or ceramic-to-metal composites and seals, have been designed to minimize the stresses developed at the bond interface because of its relatively poor strength. It is generally known that those glasses and ceramics which possess the desirable bonding and sealing characteristics also have coefficients of thermal expansion which are substantially smaller than the coefficients of thermal expansion of most metals and alloys. Therefore, the prior art has developed a series of low expansivity metal alloys, which have coefficients of thermal expansion for a limited temperature range which reasonably closely match the coefficients of thermal expansion of many sealing glasses or ceramics.

Unfortunately, the range of low expansivity alloys which have been developed are not otherwise particularly desirable materials. In the first place, they are characteristically quite costly. Further, since almost all are nickel based alloys contain large proportions of nickel, their thermal and electrical conductivity is very poor. The corrosion resistance of the majority of the low expansivity alloys is also relatively poor. It is known that to obtain good glass adherence particularly to the bare low expansivity alloys, they usually require pretreatment to form a relatively thick oxide film. Further, the oxides formed, e.g., iron oxides, nickel oxides, cobalt oxides and mixtures thereof are not very desirable from the point of view of their mechanical and other characteristics.

In accordance with the invention of U.S. Pat. No. 3,676,292, it was found that a copper base alloy within certain ranges of composition forms on its surface an oxide layer, one compound of which is $Al_2O_3$ in the form of a compact continuous film. The $Al_2O_3$ film forms immediately adjacent to the metal surface and is strongly adherent to it. The $Al_2O_3$ film comprises at least 10% of the total oxide film thickness. When a glass or ceramic is bonded to this copper base alloy having the $Al_2O_3$ film, a strong bond results.

Because of the high bond strength between this copper base alloy and the glass or ceramic, it is possible to fabricate glass or ceramic-to-metal composites or seals with a high degree of mismatch of coefficient of thermal expansion between the glass or ceramic and the metal. Therefore, the glass or ceramic-to-metal composites or seals in accordance with this invention eliminate the necessity of using the costly nickel containing low expansivity alloys and, further, they may be fabricated without the oxidizing pretreatment usually employed with the low expansivity alloys of the prior art. There is also a marked improvement in electrical and thermal conductivity as compared to the low expansivity alloys.

It is accordingly an object of this invention to provide a glass or ceramic-to-metal composite or seal having improved bond strength between the glass or ceramic and the metal, and to provide a process of making same.

It is a further object of this invention to provide a glass for a glass-to-metal composite or seal wherein the metal is a copper base alloy which forms a thin film of $Al_2O_3$ on its surface.

In accordance with this invention, it has been found that copper base alloys with relatively higher thermal expansivities than the glosses can be used in glass-to-metal composites or seals provided that the copper base alloy has certain inherent oxidation characteristics. The characteristics required in the copper alloy are that it has formed on its surface an oxide, one component of which is $Al_2O_3$ in the form of a compact continuous film. This $Al_2O_3$ film must form immediately adjacent to the metal, be strongly adherent to it and comprise at least 10% and up to 100% of the total oxide film thickness. Suitable copper base alloys for use in the glass or ceramic-to-metal composites or seals of this invention contain from 2 to 12% aluminum. Preferably, they contain from 2 to 10% aluminum, 0.001 to 3% silicon and a grain refining element selected from the group consisting of iron up to 4.5%, chromium up to 1%, zirconium up to 0.5%, cobalt up to 1 %, and mixture of these grain refining elements. In particular, C.D.A. Alloy 638 containing 2.5 to 3.1% aluminum, 1.5 to 2.1% silicon and 0.25 to 0.55 % cobalt is most useful in the glass or ceramic-to-metal composites or seals of this invention. Impurities may be present in amounts not adversely affecting the properties of the glass or ceramic-to-metal composites or seals of this invention. In particular, the impurities may include less than 1% zinc; less than 1% nickel; less than 1% manganese; less than 1% tin; less than 0.5% lead; less than 0.1% phosphorus; and less than 0.1% arsenic.

The alloys useful with this invention and especially Alloy 638* have excellent high temperature oxidation resistance due to the formation of the protective alumina film. When the metal is oxidized in air, the alumina film is overlain with a thin layer of copper oxides. Controlled oxidation in a wet reducing atmosphere prevents the formation of the copper oxides and induces a film to form which is substantially completely alumina. Alumina seals efficiently to most glasses and ceramics. Therefore, since the alumina film formed on the alloys used with this invention is tightly adherent to the alloys, an excellent glass or ceramic-to-metal bond is produced.

*C.D.A. copper base alloy 638 contains 2.5 to 3.1% Al, 1.5 to 2.1% Si and 0.25 to 0.55 Co.

It has been found that maximum strength, at the relatively low firing or fusing temperatures of from about 300° to about 1000° C., along with outstanding flow and metal-wetting characteristics are achieved by a sealing glass for use in the invention disclosed in U.S. Pat. No. 3,676,292, is obtained by the following range of glass compositions:

| | |
|---|---|
| $B_2O_3$ | 0 – 6 Wt. % |
| PbO | 75 – 90 |
| $F_2$ | 0 – 10 |
| $SiO_2$ | 2 – 8 |

The foregoing components totaling 100 as they vary within their indicated ranges.

The preferred range of glass composition of this invention:

| | |
|---|---|
| $B_2O_3$ | 2 – 5 Wt. % |
| PbO | 85 – 90 |
| $F_2$ | 2 – 8 |
| $SiO_2$ | 3 – 7 |

The foregoing components totaling 100 as they vary within their indicated ranges.

The preferred composition:

| | | |
|---|---|---|
| $B_2O_3$ | 3.93 | Wt. % |
| PbO | 86.30 | |
| $F_2$ | 4.98 | |
| $SiO_2$ | 4.79 | |
| | 100.00 | |

The foregoing preferred composition is smelted into a glass by first weighing out the following raw batch materials:

| | | |
|---|---|---|
| Boric Acid Regular | 7.10 | Wt. % |
| Litharge | 44.40 | |
| Lead Flouride | 43.80 | |
| Powdered Quartz | 4.70 | |
| | 100.00 | |

The foregoing powdered raw materials are thoroughly mixed, charged into any suitable type crucible or box smelter, and are melted and fused into a homogeneous glass at a temperature of from about 1600° to about 1600° F., following which the molten glass is quenched in water, fritted and dried.

The frit is then powdered, and following the teachings of U.S. Pat. No. 3,676,292, outstanding composites are achieved, comprising one component of the glass of this invention bonded to at least one copper-based alloy component. The latter comprising 2 to 12% aluminum, with the balance essentially copper.

As is well known, by any of many well-known computations, various raw materials may be used to make up the foregoing raw batch, appropriate factors being utilized, for example, lead silicate or lead fluosilicate could be partially utilized to supply some of the PbO, $F_2$ and $SiO_2$ components of the preferred, final glass.

In like manner, the raw batch could be readily adjusted to provide any final glass composition within the broader ranges of compositions disclosed above.

What is claimed is:

1. In a composite comprising one glass component bonded to at least one copper-base alloy component comprising 2 to 12% aluminum and the balance essentially copper, said alloy component, just prior to bonding said glass component thereto, having had an $Al_2O_3$ containing oxide film on the bonding surface thereof, the improvement consisting essentially of the glass component having the following composition:

| | |
|---|---|
| $B_2O_3$ | 2 to 5 Wt. % |
| PbO | 85 to 90 Wt. % |
| $F_2$ | 2 to 8 Wt. % |
| $SiO_2$ | 3 to 7 Wt. % | the foregoing components totalling 100 Wt. % as they vary within their indicated ranges.

2. In a composite comprising one glass component bonded to at least one copper-base alloy component comprising 2 to 12% aluminum and the balance essentially copper, said alloy component, prior to bonding said glass component thereto, having had an $Al_2O_3$ containing oxide film on the bonding surface thereof, the improvement consisting essentially of the glass component having the following compositon:

| | |
|---|---|
| $B_2O_3$ | 3.93 Wt. % |
| PbO | 86.30 Wt. % |
| $F_2$ | 4.98 Wt. % |
| $SiO_2$ | 4.79 Wt. % |

3. In a hermetic seal comprising one glass component bonded to at least one metal component, wherein said metal component comprises a copper-base alloy containing from 2 to 12% aluminum and the balance essentially copper, and said alloy component, prior to bonding said glass component thereto, having had an $Al_2O_3$ containing oxide film on the bonding surface thereof, the improvement consisting essentially of the glass component having the following composition:

| | |
|---|---|
| $B_2O_3$ | 2 to 5 Wt. % |
| PbO | 85 to 90 Wt. % |
| $F_2$ | 2 to 8 Wt. % |
| $SiO_2$ | 3 to 7 Wt. % | the foregoing components totalling 100 Wt. % as they vary within their indicated ranges.

4. In a hermetic seal comprising one glass component bonded to at least one metal component, wherein said metal component comprises a copper-base alloy containing from 2 to 12% aluminum and the balance essentially copper, said alloy component, prior to bonding said glass component thereto, having had an $Al_2O_3$ containing oxide film on the bonding surface thereof, the improvement consisting essentially of the glass component having the following composition:

| | |
|---|---|
| $B_2O_3$ | 3.93 Wt. % |
| PbO | 86.30 Wt. % |
| $F_2$ | 4.98 Wt. % |
| $SiO_2$ | 4.79 Wt. % |

* * * * *